United States Patent [19]

Fujimura et al.

[11] Patent Number: 5,034,090

[45] Date of Patent: Jul. 23, 1991

[54] PROCESS FOR MANUFACTURING SEMICONDUCTOR DEVICE INVOLVING DRY ETCHING AN ORGANIC RESIST LAYER

[75] Inventors: Shuzo Fujimura, Tokyo; Hiroshi Yano, Yokohama, both of Japan

[73] Assignee: Fujitsu Limited, Kawasaki, Japan

[21] Appl. No.: 462,293

[22] Filed: Dec. 29, 1989

Related U.S. Application Data

[63] Continuation of Ser. No. 44,480, May 1, 1987, abandoned.

[30] Foreign Application Priority Data

May 1, 1986 [JP] Japan .................... 61-099417

[51] Int. Cl.$^5$ .................................. H01L 21/00
[52] U.S. Cl. ......................... 156/643; 156/646; 156/657; 156/659.1; 156/668; 156/904
[58] Field of Search ............. 156/657, 904, 659.1, 156/668, 643, 646; 430/325, 329; 437/228, 229

[56] References Cited

U.S. PATENT DOCUMENTS 4,634,496  1/1987  Mase et al. ............... 156/659.1 X
4,675,273  6/1987  Woods et al. ............... 156/643 X
4,680,084  7/1987  Heimann et al. ............ 156/904 X

OTHER PUBLICATIONS

Solid State Technology, vol. 14, No. 9, Sep. 1971, "Properties and Process for Photoresists in Semiconductor Manufacture", by K. G. Clark, pp. 48–53.
Chemisch Magazine, Apr. 1986, "Zuiver Chemicalien Voor De Halfgeleiderindustrie", by U. D. Postma, pp. 289–293, Rijswijk.
Extended Abstracts, vol. 86-2, Oct. 19–24, 1985, "New Device Degradation Mechanism: Heavy Metal Contamination from Resist During Plasma Stripping", by S. Fujimura et al., Abstract No. 305, Princeton, New Jersey, pp. 456–457.
Solid State Technology, vol. 28, No. 5, May 1985, "Dry Etch Resistance of Metal-Free and Halogen-Substituted Resist Materials", by H. Gokan et al., Port Washington, New York, pp. 163–167.

Primary Examiner—David A. Simmons
Assistant Examiner—Thi Dang
Attorney, Agent, or Firm—Staas & Halsey

[57] ABSTRACT

In the manufacture of a semiconductor device, the dry etching of a resist layer of an organic material can be utilized without decreasing the yield of the semi-conductor layer, by using a resist layer of an organic material containing heavy metals in an amount of less than 20 ppb for each heavy metal.

9 Claims, 2 Drawing Sheets

PROCESS FOR MANUFACTURING SEMICONDUCTOR DEVICE INVOLVING DRY ETCHING AN ORGANIC RESIST LAYER

This is a continuation of copending application Ser. No. 07/044,480 filed on May 1, 1987, now abandoned.

BACKGROUND OF THE INVENTION

1. Field of the Invention

The present invention relates to a process for manufacturing a semiconductor device involving dry etching an organic resist layer on a substrate on which another layer is subsequently formed.

2. Description of the Related Art

The processing of a semiconductor substrate using a resist layer of an organic material including a photoresist as a mask is widely used in the manufacture of semiconductor devices. In this processing, a resist layer is locally formed on a part of a semiconductor substrate, for example, an eptaxial layer, and subsequently, selective etching, ion implantation, etc., are carried out on the semiconductor substrate using the resist layer as a mask. The resist layer is then removed. To remove the resist layer, wet etching, for example, chemical etching, has been used, but dry etching such as plasma etching is now increasingly used since the disposal of waste matters is easier in dry etching than in wet etching. Therefore, there is a desire to use dry etching in the removal of a resist layer used as a mask in the processing of a semiconductor substrate.

However, although a resist layer of an organic material can be removed by wet etching without problems, the removal of a resist layer of an organic material on a substrate by dry etching causes the formation of particles on the surface of the substrate, and as a result, a layer deposited thereon becomes rough surface. For example, if a polycrystalline silicon layer is deposited on a substrate containing the particles as mentioned above, bright points (particles which can be observed as bright point in the dark field of microscope) appear in the polycrystalline silicon layer, which are nuclei of crystal defects, and the thickness of the resulting polycrystalline silicon layer is non-uniform or the top surface of the polycrystalline silicon layer is uneven. These defects, rough surface, etc., may cause a deterioration of the characteristics of semiconductor devices having such a polycrystalline silicon layer or of another layer superimposed on the polycrystalline polysilicon layer, which may have reflected defects or rough surface.

Accordingly, it has been considered that dry etching should not be used for the removal of a resist layer, and the reasons therefor have not been investigated.

SUMMARY OF THE INVENTION

The object of the present invention is to enable the utilization of a dry etching of a resist layer of an organic material in the manufacture of a semiconductor device.

This and other objects, features and advantages of the present invention are attained by providing a process for manufacturing a semiconductor device comprising the steps of: preparing a substrate; locally forming a resist layer of an organic material on a first area of the substrate, the organic material containing heavy metals in an amount of less than 20 ppb for each heavy metal; carrying out a required process on the substrate with the resist layer thereon; removing the resist layer by dry etching; and then depositing a layer of one of semiconductor and insulator materials on the substrate in a second area including at least a part of the first area.

The term heavy metals as used herein denotes metals having an atomic number of 21 or more, including iron (Fe), nickel (Ni), chromium (Cr), etc.

The amount of each of the heavy metals in an organic resist layer should be less than 20 ppb (parts per billion), preferably less than 5 ppb. Generally, the amount of iron in an organic resist material tends to be large such as more than about 150 ppb to about 1000 ppb because a reactor for producing resist materials is made of stainless steel etc., but decreasing the contents of other heavy metals in resist materials is relatively easy. Therefore, preferably an organic resist material having a content of iron of less than 20 ppb and contents of the other heavy metals of less than 5 ppb is used. An organic resist layer having a total content of the heavy metals of less than 20 ppb is most preferable.

DESCRIPTION OF THE PREFERRED EMBODIMENTS

In the prior art, it has been known that the existence of heavy metals in a semiconductor crystal has a disadvantageous affect on the characteristics of semiconductor devices. However, it has not been known that the heavy metal content of an organic resist material causes a deterioration of a semiconductor device when a resist layer is removed by dry etching. Conventional organic resist materials including organic photoresist materials contain heavy metals in an amount of about 100 ppb to about 1000 ppb and this content of heavy metals has been considered as not causing a problem. Further, it has not been known that a deterioration of the characteristics of a semiconductor device comes from defects, rough surface, etc., of a layer formed on a substrate on which a resist layer of an organic material has been formed and then removed by dry etching.

The inventors coated a novolak-system positive type resist layer having an iron content of 150 ppb, 230 ppb, 360 ppb, or 540 ppb and content of other heavy metals such as copper and nickel of less than 5 ppb, to a thickness of about 1 $\mu$m on a silicon dioxide layer and carried out patterning thereon. Here, the content of heavy metals was measured by atomic absorption spectroscopy. Boron ions were then locally implanted through the silicon dioxide layer into a silicon substrate at a dose of about $1 \times 10^{13}$ cm$^{-2}$, using the resist layer as a mask. The resist layer was then removed by oxygen plasma etching. The conditions for the plasma etching were as follows:

Oxygen flow rate: 50 cc/min
Oxygen pressure: 1 Torr
Power source frequency: 13.56 Hz
High frequency power: 300 W After the resist layer was removed, a polycrystalline silicon layer having a thickness of about 400 nm was deposited on the silicon dioxide layer by chemical vapor deposition (CVD). Bright points appeared in the polycrystalline silicon layer and the number of bright points was counted for each case. The results are shown in FIG. 1, in which the abscissa indicates the iron content and the ordinate indicates the relative number of bright points in comparison with the number of bright points when wet etching is used for removing a resist layer of an organic material.

Figure 1:
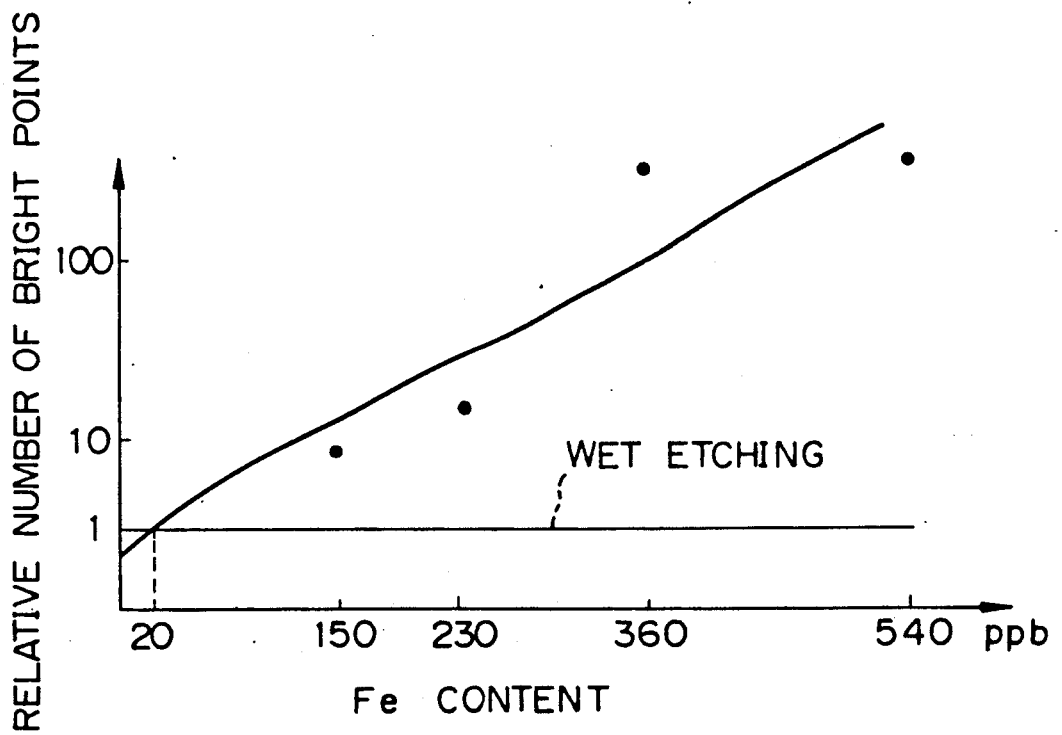
FIG. 1 shows a relationship between the number of bright points and the content of iron in an organic resist material.

From FIG. 1, it can be seen that, when the iron content in the organic material of the resist layer is less than 20 ppb, the number of bright points is equal to or less than that when a resist layer is removed by wet etching, and does not cause problems in a semiconductor device.

Next, an EPROM (erasable and programmable read only memory), a type of MIS (metal-insulator-semiconductor) FET (field effect transistor), was manufactured using an organic resist material as a mask to form source and drain doped regions, and a polycrystalline silicon layer to form a floating gate.

Figure 2A:
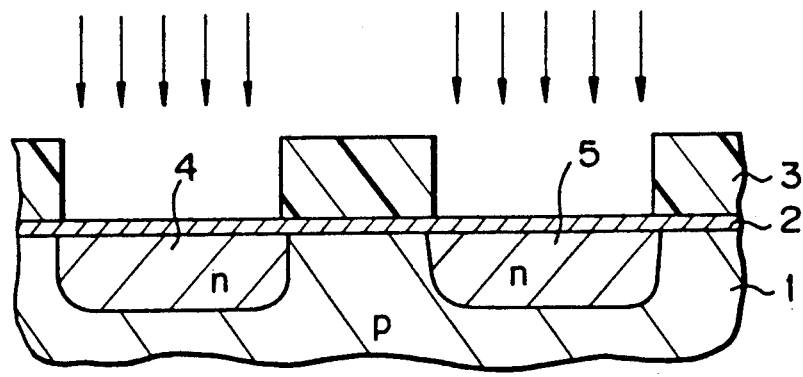
FIGS. 2A, 2B and 2C are sectional views of an EPROM in main steps of manufacturing same.

Referring to FIG. 2A, the surface of an p-type silicon substrate 1 was oxidized to form a silicon dioxide layer 2 having a thickness of 40 nm as a gate insulating layer on which a photoresist layer 3 having a thickness of 1.1 $\mu$m was formed and patterned to remove portions at which the source and drain are to be formed. Arsenic ions were locally implanted into the silicon substrate 1 through the silicon dioxide layer 2 using the photoresist layer 3 as a mask, to form n-type doped source and drain regions 4 and 5.

Figure 2B:
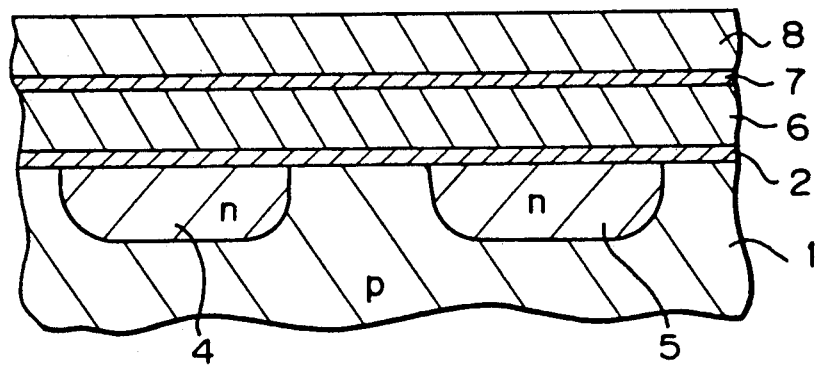

Referring to FIG. 2B, the photoresist layer 3 was removed by oxygen plasma etching under the conditions described above. After removal of the photoresist layer 3, an n-doped polycrystalline silicon layer 6 having a thickness of about 400 nm was deposited by CVD. The surface of the polycrystalline silicon layer 6 was oxidized to form a silicon dioxide layer 7 having a thickness of 10 to 40 nm. An n-type polycrystalline silicon layer 8 having a thickness of 400 nm was again deposited on the silicon dioxide layer 7.

Figure 2C:
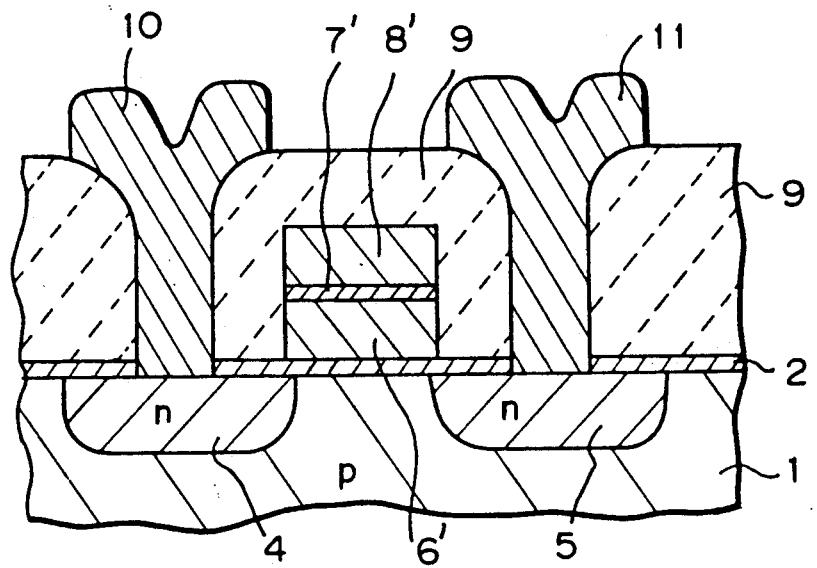

Referring to FIG. 2C, the polycrystalline silicon layer 8, the silicon dioxide layer 7, and the polycrystalline silicon layer 6 were patterned to form a gate comprising a floating gate 6', an insulating layer 7', and a polycrystalline silicon gate 8'. Then, an insulating layer 9 and source and drain electrodes 10 and 11 were formed. Thus, an EPROM was created.

In this process of manufacturing an EPROM, when the photoresist layer 3 used was made of an organic material having an iron content of 150 ppb or more, particles were left on the surface of the silicon dioxide layer 2 after the photoresist layer 3 was removed by plasma etching. As a result, the top surface of the polycrystalline layer 6 deposited on the silicon dioxide layer 2 with the particles thereon became rough and the thickness of the silicon dioxide layer 7 formed by oxidizing the rough top surface of the polycrystalline layer 6 was non-uniform. Further, the silicon dioxide layer 7 sandwiched by the two polycrystalline layers 6 and 8 had a non-uniform thickness and portions having a very thin thickness were easily broken when a voltage was applied thereto. Thus, EPROM devices manufactured by the above process or under the above conditions had a low yield.

In contrast, when the photoresist layer 3 used was made of an organic material containing an iron content of less than 20 ppb and a content of other heavy metals of less than 5 ppb, the particles did not appear, or at least the number thereof decreased, and the thickness of the silicon dioxide layer 7 was uniform, giving the same yield of the EPROM devices as when a photoresist layer was removed by wet etching.

Thus, according to the present invention, dry etching such as plasma etching can be utilized for removing a resist layer of an organic material without leaving particles, without forming bright points in a crystalline layer formed thereafter, and without deteriorating the characteristics of a semiconductor device.

We claim:

1. A method for manufacturing a semiconductor device, comprising the steps of:
   a) preparing a substrate;
   b) forming a resist layer of an organic material on the substrate, the organic material containing heavy metals in an amount less than 20 parts per billion (ppb) of iron and less than 5 ppb of other heavy metals;
   c) patterning the resist layer to leave a patterned resist layer on a first area of the substrate;
   d) treating the substrate with the patterned resist layer as a mask;
   e) removing the resist layer by drying etching; and
   f) depositing a layer, selected from one of semiconductor and insulator materials, on the substrate in a second area including at least a part of said first area.

2. A method according to claim 1, wherein said organic material contains a total of less than 20 ppb of the heavy metals.

3. A method according to claim 1, wherein said heavy metals are defined as metals having an atomic number of 21 or more.

4. A method according to claim 1, wherein said step f) of depositing a layer is carried out by chemical vapor deposition.

5. A method according to claim 1, wherein said step f) of depositing a layer is carried out by physical vapor deposition.

6. A method according to claim 1, wherein said step d) includes a local etching of the substrate using the resist layer as a mask.

7. A method according to claim 1, wherein said step d) includes a local ion implantation into the substrate using the resist layer as a mask.

8. A method according to claim 1, wherein the substrate is a semiconductor substrate.

9. A method according to claim 1, wherein the substrate is a semiconductor substrate, further including, after said step a), the substep of forming an insulating layer on the surface of the substrate, and wherein said step b) includes forming the resist layer on the insulating layer.

* * * * *

UNITED STATES PATENT AND TRADEMARK OFFICE
CERTIFICATE OF CORRECTION

PATENT NO. : 5,034,090
DATED : JULY 23, 1991
INVENTOR(S) : SHUZO FUJIMURA ET AL.

It is certified that error appears in the above-identified patent and that said Letters Patent is hereby corrected as shown below:

ON THE TITLE PAGE: UNDER------

OTHER PUBLICATIONS: Col. 2, line 5, "Zuiver" should be --Zuivere--.

Col. 4, line 28, "the resist" should be --the patterned resist--.

Signed and Sealed this

Thirteenth Day of October, 1992

Attest:

DOUGLAS B. COMER

Attesting Officer

Acting Commissioner of Patents and Trademarks